United States Patent
Bower et al.

(10) Patent No.: US 9,997,501 B2
(45) Date of Patent: Jun. 12, 2018

(54) MICRO-TRANSFER-PRINTED LIGHT-EMITTING DIODE DEVICE

(71) Applicant: X-Celeprint Limited, Cork (IE)

(72) Inventors: Christopher Bower, Raleigh, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days. days.

(21) Appl. No.: 15/608,672

(22) Filed: May 30, 2017

(65) Prior Publication Data

US 2017/0352646 A1 Dec. 7, 2017

Related U.S. Application Data

(60) Provisional application No. 62/344,148, filed on Jun. 1, 2016.

(51) Int. Cl.

| | |
|---|---|
| *H01L 25/16* | (2006.01) |
| *H01L 25/075* | (2006.01) |
| *H01L 33/62* | (2010.01) |
| *H01L 33/60* | (2010.01) |
| H01L 27/12 | (2006.01) |

(52) U.S. Cl.
CPC ........ *H01L 25/0753* (2013.01); *H01L 25/167* (2013.01); *H01L 33/60* (2013.01); *H01L 33/62* (2013.01); *H01L 27/1214* (2013.01); *H01L 2933/0033* (2013.01); *H01L 2933/0066* (2013.01)

(58) Field of Classification Search
CPC ... H01L 25/0753; H01L 33/60; H01L 25/167; H01L 33/62; H01L 27/1214; H01L 2933/0033; H01L 2933/0066
See application file for complete search history.

(56) References Cited

U.S. PATENT DOCUMENTS

| | | |
|---|---|---|
| 4,746,202 A | 5/1988 | Perilloux et al. |
| 5,060,027 A | 10/1991 | Hart et al. |
| | (Continued) | |

FOREIGN PATENT DOCUMENTS

| | | |
|---|---|---|
| EP | 1662301 A1 | 5/2006 |
| EP | 2078978 A2 | 7/2009 |
| | (Continued) | |

OTHER PUBLICATIONS

Choi, H. W. et al., Efficient GaN-based Micro-LED Arrays, Mat. Res. Soc. Symp. Proc. 743:L6.28.1-L6.28.6 (2003).

(Continued)

*Primary Examiner* — David Vu
(74) *Attorney, Agent, or Firm* — William R. Haulbrook; Alexander D. Augst; Choate, Hall & Stewart LLP

(57) ABSTRACT

A compound light-emitting diode (LED) device includes a semiconductor substrate having an active electronic circuit formed in or on the semiconductor substrate. Two or more electrically conductive circuit connection pads are formed in or on the semiconductor substrate and are electrically connected to the active electronic circuit. One or more micro-transfer printed LEDs each have at least two LED electrodes or connection pads and a fractured LED tether. An adhesive layer is disposed between the semiconductor substrate and each LED to adhere the semiconductor substrate to the LED. Two or more electrical conductors electrically connect one of the electrodes or LED connection pads to one of the circuit connection pads.

20 Claims, 7 Drawing Sheets

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,277,618 B2 | 3/2016 | Odnoblyudov et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 2001/0022564 A1 | 9/2001 | Youngquist et al. |
| 2002/0096994 A1 | 7/2002 | Iwafuchi et al. |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |

(56) References Cited

U.S. PATENT DOCUMENTS

| | | |
|---|---|---|
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0206428 A1 | 8/2012 | Cok |
| 2012/0206499 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0175498 A1 | 6/2014 | Lai |
| 2014/0183446 A1 | 7/2014 | Nago et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | Van De Ven et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |

FOREIGN PATENT DOCUMENTS

| | | |
|---|---|---|
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |

(56) References Cited

FOREIGN PATENT DOCUMENTS

| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |

OTHER PUBLICATIONS

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applicaitons, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 x 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

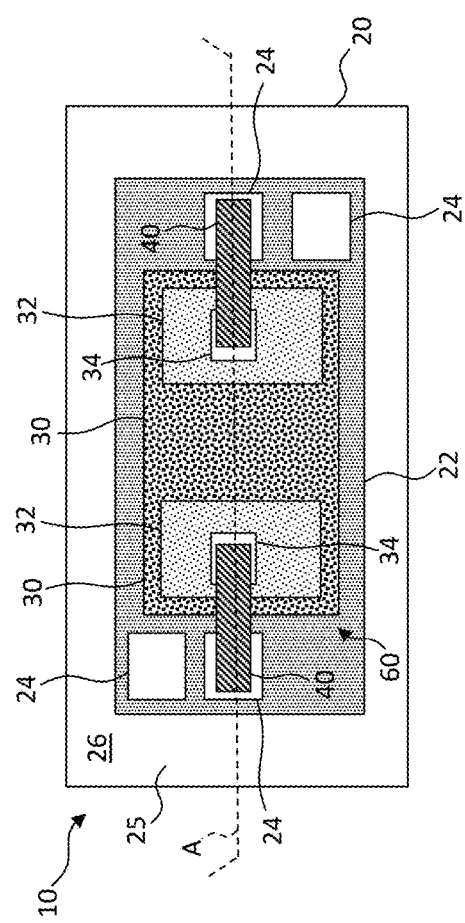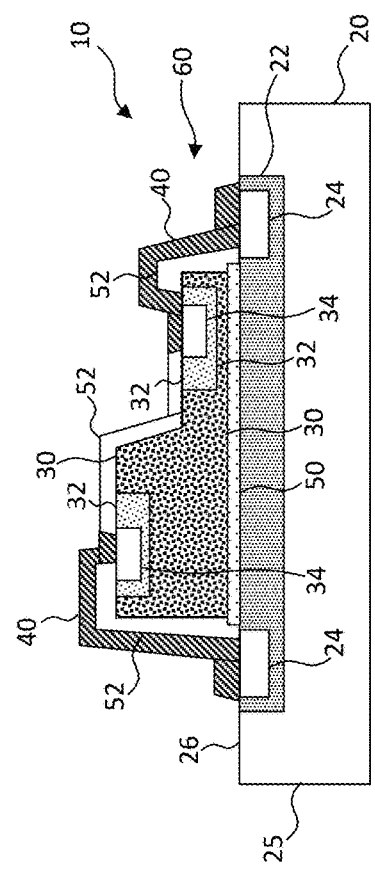

MICRO-TRANSFER-PRINTED LIGHT-EMITTING DIODE DEVICE

PRIORITY APPLICATION

This application claims priority to and benefit of U.S. Patent Application No. 62/344,148, filed Jun. 1, 2016, entitled Micro-Transfer-Printed Light-Emitting Diode Device, the content of which is hereby incorporated by reference in its entirety.

FIELD OF THE INVENTION

The present invention relates to integrated heterogeneous structures, and more particularly to light-emitting diode micro-devices, including displays.

BACKGROUND OF THE INVENTION

Micro-displays are small displays, typically having a display diameter of only a few centimeters intended for viewing by only one person at a time. Often, micro-displays are found in head-mounted virtual reality or augmented reality systems and include a separate micro-display mounted in front of each of a viewer's eyes. Typical micro-display systems include projected or direct-view displays based on liquid crystal or organic light-emitting diode devices.

Micro-displays are typically near-to-eye displays that have very high resolution, for example 2500 dpi or a pitch of approximately 10 microns. Most flat-panel displays have much lower resolution, for example less than 300 dpi and rely on thin-film transistors formed on a flat-panel substrate to operate the liquid crystals or organic light-emitting diodes. However, an organic light-emitting diode display using a micro-transfer printed active-matrix controller chips for each pixel was described in *AMOLED displays with transfer-printed integrated circuits* published in the Journal of the SID 1071-90922/11/1904-0335 in 2011. Inorganic light-emitting diode displays are also known. U.S. Patent Application Publication No. 2015/0327388 para. [0110] describes micro-transfer printed active components forming pixels in a display that include a controller controlling light-emitting diodes. However, the controller chips can have a size as large as or larger than the high-resolution pixels in a micro-display, making it difficult to maintain a very high resolution.

For some applications, particularly augmented reality applications in outdoor conditions, bright displays are necessary to provide adequate contrast for a user to view projected information. However, LCD devices and OLED devices can have inadequate brightness. Although increased power provided to such devices can increase brightness, increased power can reduce display and battery lifetime. There is a need, therefore, for a micro-display system with improved brightness, display lifetime, and battery life.

SUMMARY OF THE INVENTION

In embodiments of the present invention, a compound light-emitting diode (LED) device includes a semiconductor substrate having an active electronic circuit formed in or on the semiconductor substrate. Two or more electrically conductive circuit connection pads are formed in or on the semiconductor substrate and electrically connect to the active electronic circuit. One or more LEDs have at least two LED electrodes or connection pads and a fractured LED tether. An adhesive layer is disposed between the semiconductor substrate and each LED. Each LED is micro-transfer printed on the adhesive layer and the adhesive layer adheres the semiconductor substrate to the LED. Two or more electrical conductors each electrically connect one of the electrodes or LED connection pads to one of the circuit connection pads. The active electronic circuit can be located at least partially between the LED and the semiconductor substrate and can be an active-matrix control circuit for the LEDs.

The one or more LEDs can be horizontal or vertical, top emitting or bottom emitting with the connection pads on the same side or on opposite sides. The electrodes can be transparent. The LEDs can be different and therefore emit different colors in a display color pixel.

A method of making a compound light-emitting diode (LED) device comprises providing a semiconductor substrate having an active electronic circuit formed in or on the semiconductor substrate and two or more electrically conductive circuit connection pads formed on the semiconductor substrate, the active electronic circuit electrically connected to the two or more circuit connection pads, providing one or more LEDs, each LED having at least two LED connection pads and a fractured LED tether, disposing an adhesive layer between the semiconductor substrate and each LED, disposing each LED on the adhesive layer and the adhesive layer adheres the semiconductor substrate to the LED, and forming two or more electrical conductors, each electrical conductor electrically connecting one of the LED connection pads to one of the circuit connection pads. The one or more LEDs can be micro-transfer printed from a source wafer to the semiconductor substrate.

Embodiments of the present invention provide improved brightness, resolution, device lifetime, and battery lifetime in a micro-display. By integrating active control electronic circuits in the semiconductor substrate rather than in a separate controller chip, LEDs can be disposed on or over the active electronic circuits, reducing the area needed for micro-transfer printed devices in the display and increasing the display resolution.

In one aspect, the disclosed technology includes a compound light-emitting diode (LED) device, including: a semiconductor substrate having an active electronic circuit formed in or on the semiconductor substrate; two or more electrically conductive circuit connection pads formed in or on the semiconductor substrate, the active electronic circuit electrically connected to the two or more circuit connection pads; one or more LEDs, each LED having at least two LED electrodes or connection pads and a fractured LED tether; an adhesive layer disposed between the semiconductor substrate and each LED, wherein each LED is micro-transfer printed on the adhesive layer and the adhesive layer adheres the semiconductor substrate to the LED; and two or more electrical conductors, each electrical conductor electrically connecting one of the electrodes or LED connection pads to one of the circuit connection pads.

In certain embodiments, the active electronic circuit is located at least partially between the LED and the semiconductor substrate.

In certain embodiments, the LED has an opposite side opposite the semiconductor substrate and at least two of the LED connection pads are located on the opposite side.

In certain embodiments, the LED has an adjacent side adjacent to the semiconductor substrate and at least two of the LED connection pads are located on the adjacent side.

In certain embodiments, the LED has an opposite side opposite the semiconductor substrate and an adjacent side adjacent to the semiconductor substrate and at least one of the LED connection pads is located on the adjacent side and at least one of the LED connection pads is located on the opposite side.

In certain embodiments, the active electronic circuit is a control circuit that controls the one or more LEDs.

In certain embodiments, the compound LED device includes three LEDs, each LED having a different material, crystalline structure, or color of light emission.

In certain embodiments, the compound LED device includes a plurality of groups of three different LEDs, the groups arranged in an array over the semiconductor substrate.

In certain embodiments, the active electronic circuit is an active-matrix circuit.

In certain embodiments, the semiconductor substrate is a silicon substrate and each LED includes a compound semiconductor.

In certain embodiments, the compound LED device includes two or more connection posts, each connection post electrically connected to a circuit connection pad or an LED connection pad.

In certain embodiments, the semiconductor substrate is a display substrate and the one or more LEDs form a display.

In certain embodiments, the display is a color display.

In certain embodiments, each LED is directly or indirectly adhered to the semiconductor substrate with an adhesive layer.

In certain embodiments, the adhesive is a cured adhesive.

In certain embodiments, the semiconductor substrate has a process side, the electronic circuit is formed on or in the process side, and the LED is micro-transfer printed on the process side.

In certain embodiments, the semiconductor substrate or one or more LEDs has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm.

In certain embodiments, the compound LED device includes a reflective structure around each LED that reflects light emitted by the LED out of the compound LED device.

In another aspect, the disclosed technology includes a method of making a compound light-emitting diode (LED) device, including: providing a semiconductor substrate having an active electronic circuit formed in or on the semiconductor substrate and two or more electrically conductive circuit connection pads formed on the semiconductor substrate, the active electronic circuit electrically connected to the two or more circuit connection pads; providing one or more LEDs, each LED having at least two LED connection pads and a fractured LED tether; disposing an adhesive layer between the semiconductor substrate and each LED; disposing each LED on the adhesive layer and the adhesive layer adheres the semiconductor substrate to the LED; and forming two or more electrical conductors, each electrical conductor electrically connecting one of the LED connection pads to one of the circuit connection pads.

In certain embodiments, the method includes micro-transfer printing the one or more LEDs from a source wafer to the semiconductor substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a schematic plan view of an illustrative embodiment of the present invention;

FIG. 1B is a cross section of an illustrative embodiment of the present invention taken across the cross section line A of FIG. 1A;

Figure 2:
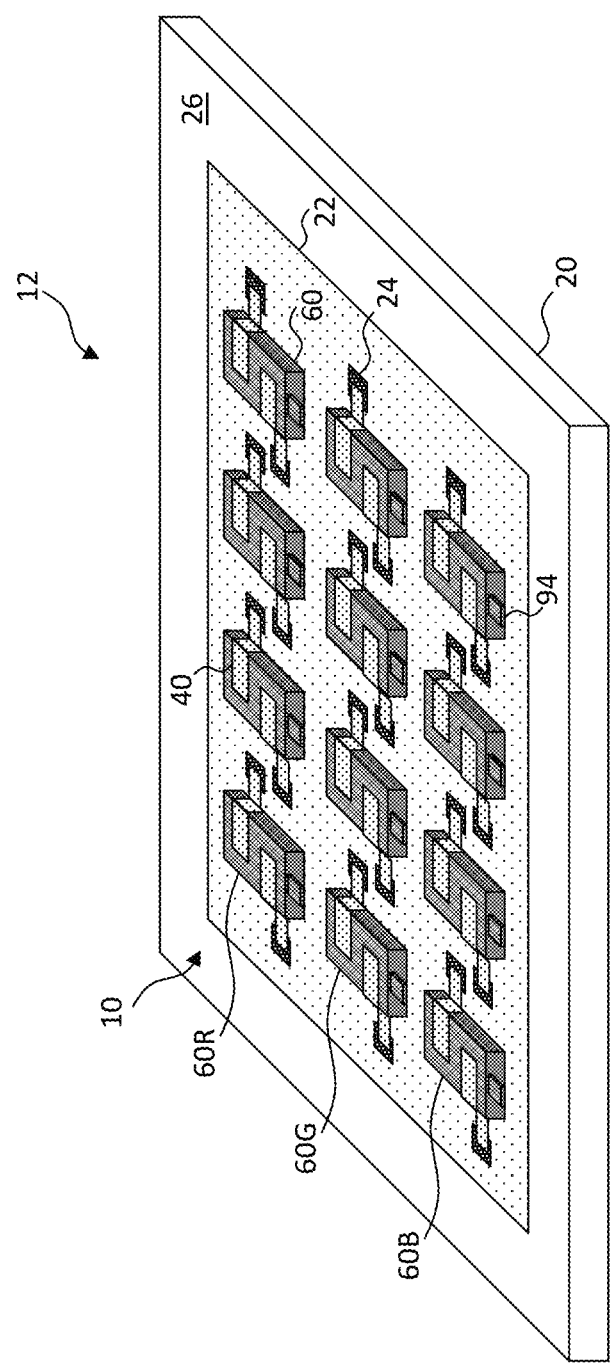
FIG. 2 is a perspective of an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale at least because the variation in size of various elements in the Figures is too great to permit depiction to scale.

DETAILED DESCRIPTION OF THE INVENTION

Referring to the schematic plan view of FIG. 1A, the schematic cross section of FIG. 1B taken across cross section line A of FIG. 1A, and the perspective of FIG. 2, in an embodiment of the present invention, a compound LED device 10 includes a semiconductor substrate 20. The semiconductor substrate 20 can be a silicon substrate. The semiconductor substrate 20 includes an active electronic circuit 22, for example a CMOS transistor circuit, formed in or on the semiconductor substrate 20, for example, using photolithographic methods and materials found in the integrated circuit industry. The active electronic circuit 22 can be, for example, an active-matrix circuit for driving one or more LEDs 60 in a display. The semiconductor substrate 20 or active electronic circuit 22 includes two or more electrically conductive circuit connection pads 24, formed in or on the semiconductor substrate 20, for providing control, power, or ground signals to the active electronic circuit 22 or receiving such signals from the active electronic circuit 22.

One or more LEDs 60 each have at least two LED connection pads 34 and a fractured LED tether 94 (as shown in FIG. 2). The LED 60 can include LED semiconductor material 30, such as a compound semiconductor material that emits light when electrically stimulated. A compound semiconductor material can have a layered structure, such as a single-quantum-well or multi-quantum-well structure. Two or more electrodes 32 are in electrical contact with the LED 60 through the LED connection pads 34 and insulated from the LED 60 elsewhere by the dielectric structure 52 (as shown in FIG. 1B). The LED 60 is micro-transfer printed on, over, or in an adhesive layer 50 between the semiconductor substrate 20 and the LED 60. Thus, the active electronic circuit 22 can be located at least partially between the LED 60 and the semiconductor substrate 20.

LED connection pads 34 are in electrical contact with the electrodes 32 and are electrically connected with electrical conductors 40, such as wires, to the circuit connection pads 24. The LED connection pads 34 can be the electrodes 32, a portion of the electrodes 32, or a separate electrically conductive structure or patterned layer. The electrodes 32 can be, or can be a part of, the electrical conductors 40. The LED connection pads 34, the electrodes 32, and the electrical conductors 40 can be a common electrically conductive element formed in a common step or in a common process. The LED connection pads 34 need not be a distinct element from the electrical conductors 40 or electrodes 32. Alternatively, the LED connection pads 34, the electrodes 32, or the electrical conductors 40 can be made in separate steps of different materials. Connection pads are also known as contact pads for making electrical contact with a conductor to form an electrical connection.

The adhesive layer 50 can be a layer formed on the semiconductor substrate 20 or on the LED 60, or a layer disposed between the semiconductor substrate 20 and the LED 60. The adhesive layer 50 can be patterned and need not be uniformly present over the semiconductor substrate 20. For example, the adhesive layer 50 can be present only in locations where the LEDs 60 are intended and can cover only a portion of the LED area. The adhesive layer 50 can be coated, provided as a laminate, or deposited (e.g., inkjet deposited) either on the semiconductor substrate 20 or the LED 60. Inkjet deposition can provide a pattern of drops, for example drops whose location corresponds to the location of the LEDs 60. The LED 60 can include a substrate that is separate, distinct, and independent from the semiconductor substrate 20. The circuit connection pads 24 can be connected to the active electronic circuit 22, if present, and the active electronic circuit 22 is a control circuit that can, at least in part, control the LED 60. Additional conductive elements such as wires can be provided on the semiconductor substrate 20, for example electrically connected to the circuit connection pads 24 forming a circuit, such as a passive circuit, or connected to the active electronic circuit 22. As intended herein, the semiconductor substrate 20 can include layers of materials other than semiconductor materials, for example patterned conductors, dielectrics, and other circuit elements found in integrated circuits.

The compound LED device 10 is a compound device because it incorporates two different structures (e.g., the semiconductor substrate 20 and the LED semiconductor material 30). In certain embodiments, the semiconductor substrate 20 and the LED semiconductor material 30 include, incorporate, or are two different materials. The two different materials can have different attributes, can be processed separately, and can be photolithographic-process incompatible.

One or more electrical conductors 40 electrically connect one or more of the circuit connection pads 24 to one or more of the electrodes 32 through the LED connection pads 34. The active electronic circuit 22 or additional conductive elements on the semiconductor substrate 20, if present, are thus electrically connected to the electrodes 32 and can provide signals to electrically stimulate and operate the LEDs 60. The semiconductor substrate 20 can have a process side 26 over which the LED 60 is micro-transfer printed. The LED 60 can have an area over the semiconductor substrate 20 that is smaller than the area of the active electronic circuit 22.

Referring to FIG. 2, an array of LEDs 60 is disposed over the active electronic circuit 22 on, over, or in the semiconductor substrate 20. The active electronic circuit 22 likewise has an array of circuit connection pads 24 electrically connected by electrical conductors 40 to the LEDs 60. In some embodiments of the present invention, the LEDs 60 include different LEDs 60 for example red LEDs 60R that emit red light, green LEDs 60G that emit green light, and blue LEDs 60B that emit blue light. Each LED 60 can have a different material, crystalline structure, or color of light emission and can be driven with different voltages and currents.

The red, green, and blue LEDs 60R, 60G 60B can form an array of pixels each having one red, green, and blue LED 60R, 60G, 60B in a color display 12. The LEDs 60 can be micro-transfer printed so that each LED 60 has a fractured tether 94.

Figure 3:
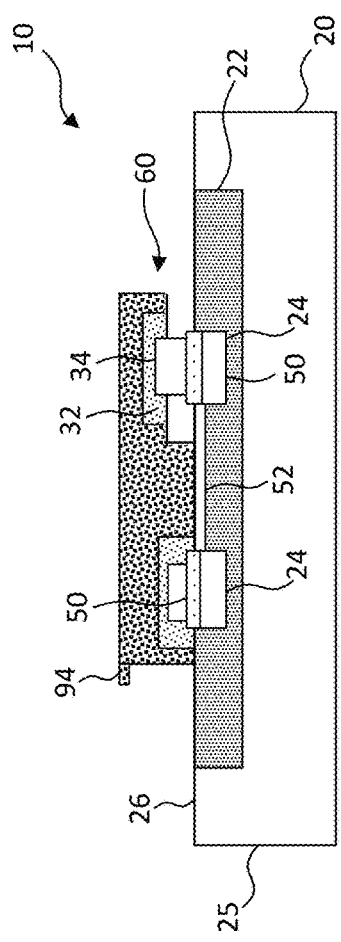
FIGS. 3 and 4 are cross sections of alternative illustrative embodiments of the present invention.
Figure 4:
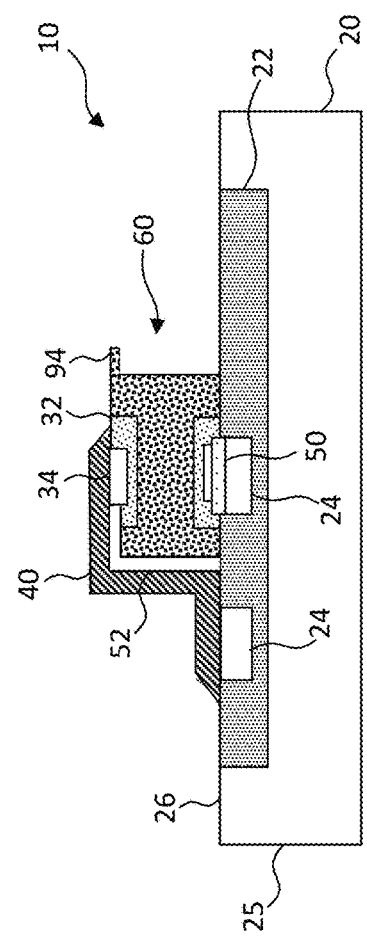

As shown in FIG. 1B, a compound LED device 10 of the present invention can have the two or more electrodes 32 formed on a common side of the LED 60 that is opposite the semiconductor substrate 20 and at least two of the LED connection pads 34 are located on the side of the LED 60 opposite the semiconductor substrate 20. Alternatively, referring to FIG. 3, a compound LED device 10 can have the two or more electrodes 32 formed on a common side of the LED 60 that is adjacent to the semiconductor substrate 20 and at least two of the LED connection pads 34 are located on the adjacent side. In yet another embodiment, referring to FIG. 4, at least one of the LED connection pads 34 is located on the opposite side of the LED 60 and at least one of the LED connection pads 34 is located on the adjacent side of the LED 60. The structures illustrated in FIGS. 1A, 1B, and 3 having LED connection pads 34 on a common side of the LED 60 are horizontal LEDs 60 and typically emit light from the side of the LED 60 opposite the LED connection pads 34. Horizontal LEDs 60 can include a conductive layer in an extended portion of the LED 60 that conducts current from one of the LED connection pads 34 to a recombination portion of the LED 60 adjacent to another LED connection pad 34. The conductive layer can be transparent. In other embodiments, the LED connection pads 34 or electrodes can be transparent. In the embodiment of FIG. 4, the LED 60 is a vertical LED 60. In a vertical embodiment, one of the LED connection pads 34 or at least a portion of the electrode 32 or electrical conductor 40 can be a transparent electrical conductor, such as ITO, allowing light to escape from the LED 60.

As shown in FIGS. 1B and 2, the LED 60 can be micro-transfer printed on or in combination with the adhesive layer 50 and adhered directly to the semiconductor substrate 20, layers formed on the semiconductor substrate 20, or on the active electronic circuit 22 or additional conductive elements formed on or in the semiconductor substrate 20, if present. In some embodiments, the active electronic circuit 22 or additional conductive elements are a part of the semiconductor substrate 20 or form layers on the semiconductor substrate 20. The semiconductor substrate 20 can include semiconductor material 25 or non-semiconductor material or layers, for example conductive, patterned conductive layers, dielectric layers, or patterned dielectric layers. For example, a dielectric layer can be disposed between portions of the active electronic circuit 22 and at least some portions of the LED 60. As used herein, "micro-transfer printing on or over" can include a step of adhering to after a micro-transfer printing operation.

A micro-transfer printed LED 60 can include at least a portion of a tether 94 from a native source wafer on which the LED 60 originates. Portions of a tether 94 result from fracturing a tether 94 on a source wafer 29 by pressing a stamp against the LED 60 during the micro-transfer printing process. The tethers 94 can be formed from one or more layers of the LED 60 or other layers disposed on the source wafer, for example an encapsulation layer. In some embodiments, the active electronic circuit 22 can be located at least partially between the LED 60 and the semiconductor substrate 20 (as shown, for example, in FIG. 1B). This arrangement can efficiently use the available area of the semiconductor substrate 20. Alternatively, the active electronic circuit 22 can be located to one or more of the sides of the LED 60 or LED 60 (not shown). In another embodiment, the active electronic circuit 22 has open areas in which the LED 60 is disposed (not shown), for example so that a bottom emitter can emit light through the open areas of an at least partially transparent semiconductor substrate 20.

To facilitate securing the LED 60 to the semiconductor substrate 20, an adhesive layer 50 or pattern of adhesive is provided between the LED 60 and the semiconductor substrate 20. The adhesive can be curable, for example, responsive to heat or electromagnetic radiation to cure and adhere the LED 60 to the semiconductor substrate 20. The adhesive can be a polymer or resin. For example, the adhesive can be SU8, photoresist, epoxy, viscous polymer, or a silicone. The adhesive can be coated on the semiconductor substrate 20 or the LED 60, or provided as a laminate between the semiconductor substrate 20 and the LED 60, or pattern-wise inkjet deposited on the semiconductor substrate 20 or the LEDs 60. The adhesive can be a solder that is reflowed to make an electrical connection and can be patterned over the circuit connection pads 24. In some embodiments, the adhesive layer 50 has an extent or area over the semiconductor substrate 20 that is different (i.e., larger or smaller) from the extent or area of the LED. The extent is taken in a plane parallel to the process side 26 of the semiconductor substrate 20 on which the LED 60 or LED 60 is micro-transfer printed. The adhesive can be patterned and materials and techniques for patterning curable adhesives are known.

In some embodiments of the present invention, the semiconductor substrate 20 can have two relatively flat and substantially parallel opposing sides and can be any structure having a process side 26 suitable for the deposition, processing, and patterning of active or passive electronic structures useful in forming patterned conductors or an active electronic circuit 22 and on which the LED 60 can be micro-transfer printed. Such structures include, but are not limited to, transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. The semiconductor substrate 20 can be glass, polymer, plastic, ceramic, semiconductor, or metal and can be rigid or flexible. For example, photolithographic processes for making integrated circuits or processing substrates can be employed with suitable semiconductor substrates 20. The semiconductor substrates 20 can include semiconductor materials such as silicon or compound semiconductor materials composed of two or more elements from different groups of the periodic table such as a III-V or II-VI semiconductor substrate 20. In some embodiments, the semiconductor substrate 20 is a crystalline semiconductor substrate 20, such as a crystalline silicon semiconductor in which circuits, such as CMOS circuits, can be formed using photolithographic processes. In certain embodiments, by using a crystalline semiconductor substrate 20, better performance is achieved than, for example, might be found in a structure using amorphous or polycrystalline semiconductor materials.

According to some embodiments of the present invention, the LEDs 60 are micro-transfer printed onto the semiconductor substrate 20. The LEDs 60 can be, for example, unpackaged bare die LEDs that are directly adhered to the semiconductor substrate 20. As also intended herein, reference to an LED 60 being micro-transfer printed on a semiconductor substrate 20 encompasses an LED 60 being micro-transfer printed on or over the active electronic circuit 22 or additional conductive elements on or in the semiconductor substrate 20 or a layer on the active electronic circuit 22, for example the adhesive layer 50. To be micro-transfer printed on or adhered to the active electronic circuit 22 means that the LED 60 is micro-transfer printed on or adhered to any of the elements of the active electronic circuit 22 or semiconductor substrate 20, for example upon a semiconductor layer, a patterned or doped semiconductor layer or structure, a conductor layer or patterned conductor, a dielectric layer, a patterned dielectric layer, a protective layer, or any other element of the active electronic circuit 22.

In contrast, as intended herein, a layer formed on a semiconductor substrate 20, for example by evaporation, sputtering, or ion beam exposure, whether patterned or not or annealed or not, is not micro-transfer printed upon or adhered to the semiconductor substrate 20 but rather is fused or welded to the underlying layer. Such a structure does not include separate, independent, and distinct substrates, one mounted upon the other, and is therefore distinct and different from a micro-transfer printed structure. As used herein, separate, independent, and distinct substrates are separately constructed, optionally at different times and at different locations using at least some different processes or on different wafers. After they are constructed, the separate, independent, and distinct substrates can be transported and stored separately and independently. Methods disclosed herein comprise micro-transfer printing one substrate (e.g., the LED 60) onto another separate, independent, and distinct substrate (e.g., the semiconductor substrate 20) and electrically interconnecting them with the electrical conductors 40. The substrates remain separate, independent, and distinct after they are combined into a common structure, since the substrates themselves both remain present in the combined structure.

The active electronic circuit 22 is a circuit that includes at least one active component or element, for example a transistor, a diode, an amplifier, an oscillator, or a switch. Passive components such as conductors, patterned conductors, resistors, capacitors, and inductors can also be included in the active electronic circuit 22. Elements of the active electronic circuit 22 are electrically connected to circuit connection pads 24. The circuit connection pads 24 are portions of the active electronic circuit 22 that are also available to make electrical connections with electrical devices external to the active electronic circuit 22, for example such as controllers, power supplies, ground, or signal connections. Similarly, the LED connection pads 34 are portions of the electrodes 32 or electrically conductive areas electrically connected to the electrodes 32. The circuit connection pads 24 or LED connection pads 34 can be, for example, rectangular or circular areas of electrically conductive materials such as the conductors listed above, accessible or exposed to external elements such as wires or conductors, including the electrical conductors 40 or electrodes 32. The circuit connection pads 24 or LED connection pads 34 can have any shape conducive to the formation of electrical connections.

Figure 5:
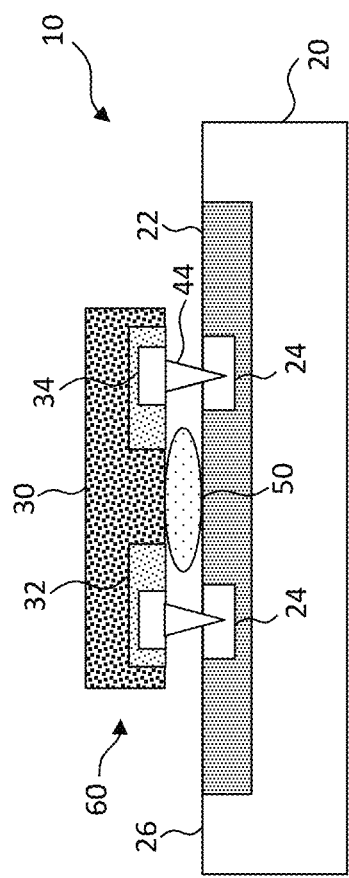
FIG. 5 is a cross section of another illustrative embodiment of the present invention.

Electrical connections to the circuit connection pads 24 can be made, for example, using solder and solder methods, photolithographic processes, conductive ink deposition by inkjet, or by contacting and, optionally, penetrating the circuit connection pads 24 with electrically conductive protrusions or spikes, such as connection posts 44, formed in or on a device with another substrate separate, distinct, and independent from the semiconductor substrate 20 and connected to electrodes 32 in the other substrate (as shown in FIG. 5). Thus, the connection posts 44 are electrically connected to both the LED connection pads 34 and the circuit connection pad 24. The other substrate can be the LED 60 and the electrically conductive protrusions or spikes can be the electrical conductors 40. Electrical connections between conductors or an active circuit on a substrate (e.g., the active electronic circuit 22 on the semiconductor substrate 20) and electrodes 32 on the LED 60 can be made by mechanically pressing conductive protrusions on the LED semiconductor material 30 in alignment against, into, onto, or through circuit connection pads 24 on the semiconductor substrate 20 to form electrical interconnections without photolithographic processing and are described in U.S. patent application Ser. No. 14/822,864 entitled "Chiplets with Connection Posts," the disclosure of which is hereby incorporated by reference herein in its entirety. In some embodiments, the LED connection pads 34 can be the base of the electrically conductive protrusions or spikes.

As intended herein, the electrically conductive protrusions or spikes pressed into, onto, or through the circuit connection pads 24 are adhered to the circuit connection pads 24 since the friction provided between the conductive protrusions or spikes and the circuit connection pads 24 causes them to adhere. The layer in which the conductive protrusions or spikes are pressed into, onto, or through the circuit connection pads 24 is therefore an adhesive layer 50. Furthermore, in some embodiments, an additional adhesive layer 50, or a portion or pattern of the adhesive layer 50 can be provided in combination with the conductive protrusions or spikes to adhere the semiconductor substrate 20 to the LED 60, as shown in FIG. 5.

The LED 60 can be any substrate or layer having light-emitting properties and on or in which electrodes 32 can be formed. For example, the LED 60 can be or include one or more of any of a semiconductor, a compound semiconductor, a III-V semiconductor, a II-VI semiconductor, GaN, AlGaN, GaAs, AlGaAs, GaAsP, AlGaP, AlGaInP, GaP, InGaN, and ZnSe. The LED 60 can be processed using photolithographic methods to form the electrodes 32 and can have two relatively flat and substantially parallel opposing sides. Alternatively, other methods such as micro-embossing and inkjet deposition can be used to form structures on the LED 60. The LED 60 can be crystalline. In some embodiments, the processing materials and methods of the LED 60 and electrodes 32 are at least partially different from and incompatible with the processing materials and methods of the semiconductor substrate 20 or active electronic circuit 22.

The semiconductor substrate 20 and the LED 60 can take a variety of forms, shapes, sizes, and materials. In some embodiments, the LED 60 is thicker than the semiconductor substrate 20. In other embodiments, the LED 60 is thinner than the semiconductor substrate 20. The LED 60 and the semiconductor substrate 20 can have the same thickness. In certain embodiments, the semiconductor substrate 20 has a thickness less than 20 microns, less than 10 microns, or less than 5 microns. In certain embodiments, the LED 60 has a thickness less than 10 microns, less than 5 microns, or less than 1 micron. Alternatively, in certain embodiments, the LED 60 has a thickness greater than 0.5 microns, greater than 1 micron, greater than 2 microns, or greater than 5 microns. Such a variety of sizes can enable highly integrated and small structures useful in a corresponding variety of electronic systems.

In some embodiments of the present invention, as illustrated in FIG. 2, a plurality of LEDs 60R, 60G, 60B, each a separate, distinct, and independent LED 60 having two or more electrodes 32, is micro-transfer printed onto or over the semiconductor substrate 20, for example in a common print step. The electrodes 32 of each of the LEDs 60 are connected to corresponding circuit connection pads 24 and LED connection pads 34 with one or more of the electrical conductors 40.

In some embodiments of the present invention, all of the LEDs 60 are substantially identical. In other embodiments, some of the LEDs 60 are different from others. For example, a first LED 60 of the plurality of LEDs 60 has one or more first attributes, a second LED 60 of the plurality of LEDs 60 has one or more second attributes and at least one of the first attributes is different from at least one of the second attributes. Attributes can include LED semiconductor material 30, crystal lattice structure, light output efficiency, or size, such as thickness, length, or width. Attributes can also include placement of electrodes, electrode material, electrode material composition or structure, or electrode size, such as thickness, length, or width.

In some embodiments of the present invention, the different LEDs 60 are formed on a common LED source wafer, for example using photolithographic processes, or from a plurality of substantially identical LED native source wafers. In another embodiment, multiple, different LED source wafers are provided having different LEDs 60 on them. For example, a first red LED wafer has first red LEDs 60R, a second green LED wafer has second green LEDs 60G, and both the first and second LEDs 60R, 60G from the respective first and second LED wafers are micro-transfer printed onto the adhesive layer 50. The LED source wafers can be different and the LEDs 60 from the different LED source wafers can be different, for example having different materials, crystal lattice structures, sizes, or electrodes, as discussed above.

In some embodiments of the present invention the LEDs 60 are chiplets. Chiplets can be small integrated circuits or processed substrates, for example bare die, that are integrated into a compound device structure using micro-transfer printing. In various embodiments, one or more LEDs 60 have a width from 2 to 5 µm, 5 to 10 µm, 10 to 20 µm, or 20 to 50 µm. In various embodiments, one or more LEDs 60 have a length from 2 to 5 µm, 5 to 10 µm, 10 to 20 µm, or 20 to 50 µm. In various embodiments, at least one of the semiconductor substrate 20 and the one or more LEDs 60 have a height from 2 to 5 µm, 4 to 10 µm, 10 to 20 µm, or 20 to 50 µm. In certain embodiments, such small structures provide a high degree of integration and consequently reduced manufacturing costs and improved performance.

In some embodiments of the present invention, the semiconductor substrate 20 includes thermal dissipation layers, for example, on a side of the semiconductor layer 20 opposite the process side 26, beneath the active electronic circuit 22, or over the active electronic circuit 22 with vias for the circuit connection pads 24. The thermal dissipation layers, for example metal or metal mesh layers, can distribute heat generated by the active electronic circuit 22 and the LEDs 60, thereby improving performance and lifetime of the compound LED device 10.

Figure 6:
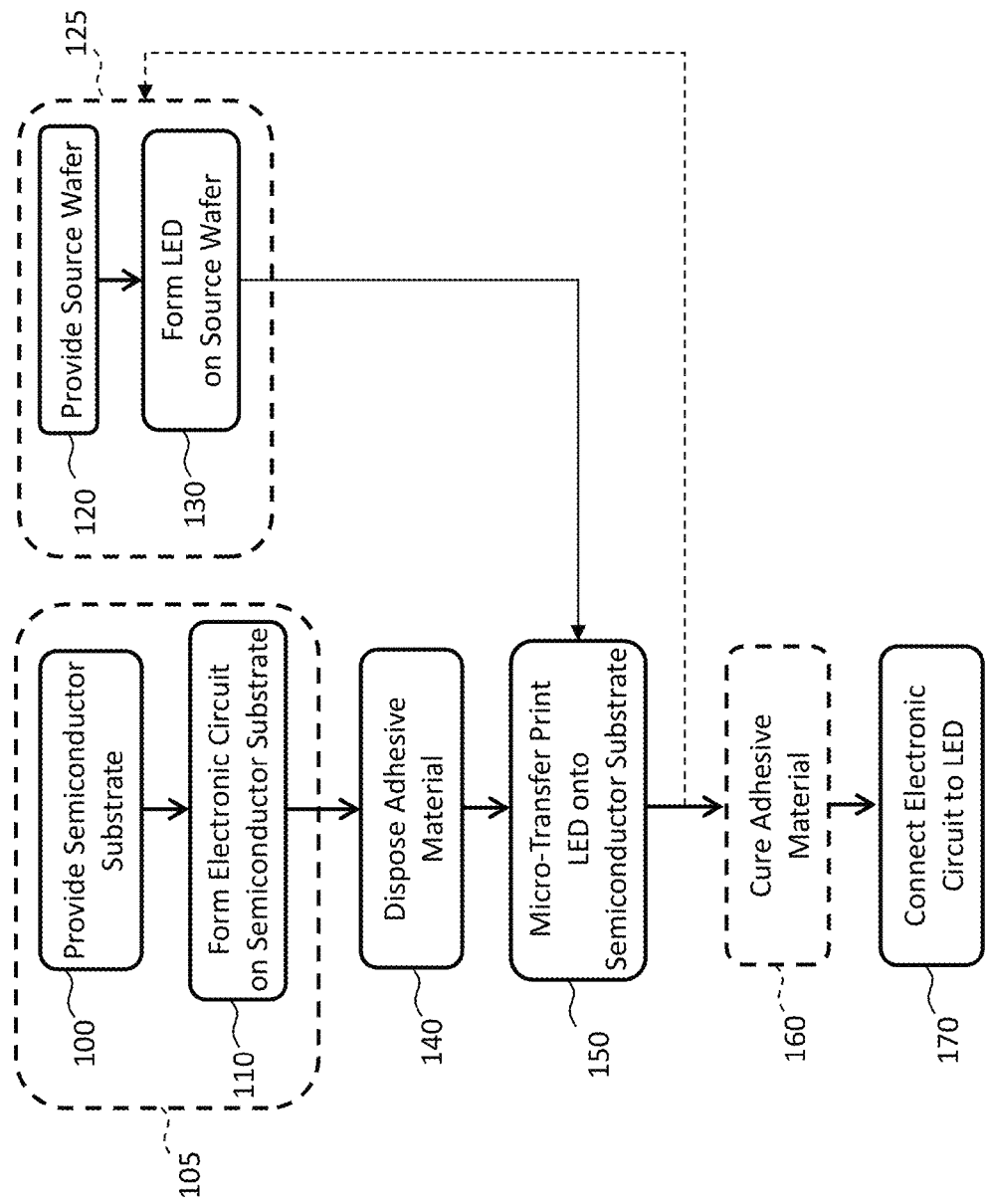
FIG. 6 is a flow diagram illustrating an exemplary method of the present invention.

Referring to FIG. 6, a method of making a compound LED device 10 includes providing a semiconductor substrate 20 in step 100. The active electronic circuit 22 is formed in or on the semiconductor substrate 20 in step 110. In some embodiments, the semiconductor substrate 20 is a semiconductor substrate 20 with active electronic components. In some embodiments, the semiconductor substrate 20 also includes passive components, for example including electrical conductors, wires, resistors, and connection pads. Alternatively, in step 105 a semiconductor substrate 20 is provided with an active electronic circuit 22 already formed in or on the semiconductor substrate 20.

The active electronic circuit 22 includes one or more circuit connection pads 24 connected to the active electronic circuit 22 for providing signals to the active electronic circuit 22 or receiving signals from the active electronic circuit 22. An LED source wafer separate, distinct, and independent from the semiconductor substrate 20 is provided in step 120 and LEDs and electrodes 32 are formed in or on the LED source wafer in step 130 to form micro-transfer printable LEDs 60. In some embodiments, the micro-transfer printable LED 60 and electrodes 32 already formed in or on a source wafer are provided in a single step 125.

A layer 50 of adhesive is disposed between the LED 60 and the semiconductor substrate 20 in step 140, for example on the LED 60, on the semiconductor substrate 20, or with a laminate located between the LED 60 and the semiconductor substrate 20. The adhesive can be a patterned layer 50 of adhesive, for example inkjet-deposited adhesive material, provided by coating, or patterned using photolithography. The LED(s) 60 are disposed on the semiconductor substrate 20 in step 150 by micro-transfer printing. In some embodiments, step 150 is repeated to provide a plurality of LED(s) 60 micro-transfer printed on the semiconductor substrate 20 (e.g., corresponding to the structure of FIG. 2) that can be printed from one or multiple different native source wafers. The adhesive can be a curable adhesive and in step 160 the adhesive layer 50 is cured to adhere the LED 60 to the semiconductor substrate 20. The adhesive layer 50 can be patterned after it is cured.

In step 170, one or more electrodes 32 are connected to the circuit connection pads 24 or the active electronic circuit 22 or additional conductive elements on the semiconductor substrate 20 (if present) through the LED connection pads 34, electrical conductors 40, and circuit connection pads 24 in step 170 to construct a compound LED device 10. This step can be provided using photolithographic deposition and patterning of conductive materials or patterned deposition of conductive materials.

Alternatively, the step 170 of connecting the circuit connection pads 34 (or active electronic circuit 22, if present) to the LED connection pads 34 and electrodes 32 can be performed in a common step with the micro-transfer step 150 using the conductive protrusions or spikes, as illustrated in FIG. 5 and described above, so that step 150 and step 170 are performed simultaneously in a common step. In these embodiments, the electrical conductors 40 include electrically conductive protrusions or spikes extending from the one or more LEDs 60 and the step 150 of micro-transfer printing the one or more LEDs 60 onto the semiconductor substrate 20 includes pressing the electrically conductive protrusions or spikes against, onto, into, or through the circuit connection pads 24 to form an electrical connection between the electrodes 32 and the circuit connection pads 24. As noted above, an adhesive layer 50 or patterned adhesive layer 50 can be used in combination with the conductive protrusions or spikes to provide electrical connections and adhesion between the LED 60 and semiconductor substrate 20.

Figure 7:
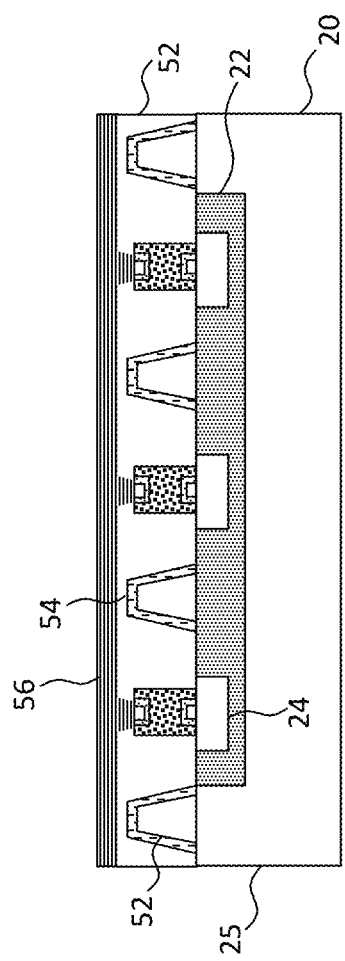
FIG. 7 is a cross section of an illustrative embodiment of the present invention.

Referring to FIG. 7, in some embodiments of the present invention, reflective layers 54 are formed on patterned dielectric structures 52 disposed between the LEDs 60 to reflect light that can be emitted horizontally to the semiconductor substrate 20 out of the compound LED device 10. FIG. 7 is a cross section; in some embodiments, the reflective layers 54 and dielectric structure 52 surround each LED 60 to form a well in which the LED 60 is disposed, for example by micro-transfer printing. A transparent electrical conductor 56 provides power to the top LED connection pad 34.

Figure 8A:
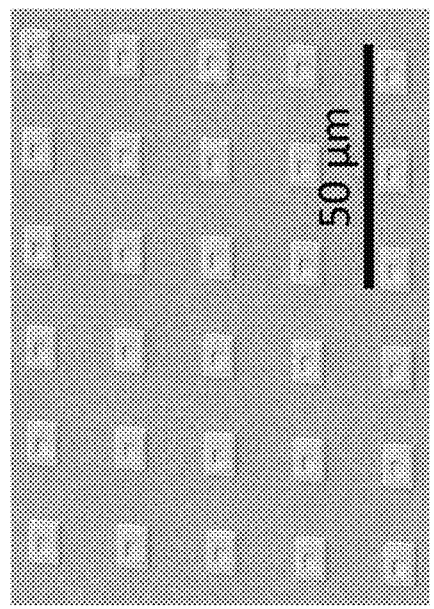
FIGS. 8A and 8B are micrographs of an array of micro-LEDs formed in a micro-display.
Figure 8B:
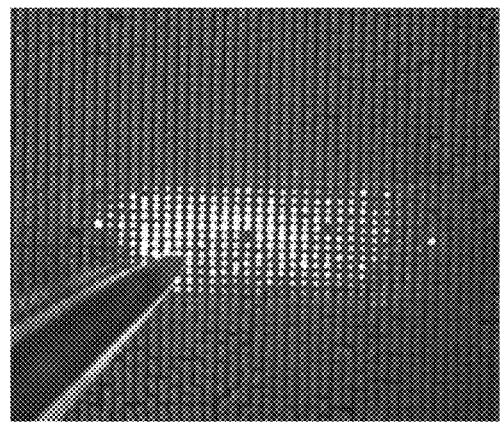

Referring to FIGS. 8A and 8B, an array of red-light-emitting vertical LEDs 60 (corresponding to structures shown in FIG. 4) were constructed and micro-transfer printed onto an Au/Sn circuit connection pad 24 with a transparent conducting oxide (ITO) electrically connecting the top electrode 32. The red-light-emitting vertical LEDs 60 had a length of approximately 10 microns and were printed with a pitch of approximately 20 microns. The LEDs 60 emitted light when provided with electrical power, as shown in FIG. 8B.

In operation, the compound LED device 10 or heterogeneous device 10 is operated by providing electrical signals from an external display controller (not shown) through circuit connection pads 24 to activate the active electronic circuit 22 on the semiconductor substrate 20. The active electronic circuit 22 can further process the signals or communicate the signals, or both, to the electrodes 32 on the LED semiconductor material 30 through the circuit connection pads 24, the electrical conductor 40, and the LED connection pads 34. The electrodes 32 provide signals to the LEDs 60 to cause them to emit light.

U.S. patent application Ser. No. 14/743,981, filed Jun. 18, 2015, entitled Micro Assembled Micro LED Displays and Lighting Elements, describes micro-transfer printing structures and processes useful with the present invention, the disclosure of which is hereby incorporated by reference herein. For a discussion of micro-transfer printing techniques that can be used or adapted for use with methods disclosed herein, see U.S. Pat. Nos. 8,722,458, 7,622,367 and 8,506,867, the disclosure of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include one or more layers there between. Additionally, "on" can mean "on" or "in." As additional non-limiting examples, a sacrificial layer or sacrificial portion 28 is considered "on" a substrate when a layer of sacrificial material or sacrificial portion 28 is on top of the substrate, when a portion of the substrate itself is the sacrificial layer 28, or when the sacrificial layer or sacrificial portion 28 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
10 compound LED device
12 display
20 semiconductor substrate
22 active electronic circuit
24 circuit connection pad
25 semiconductor material
26 process side
30 LED semiconductor material
32 electrode
34 LED connection pad
40 electrical conductor
44 connection posts
50 adhesive layer
52 patterned dielectric structure
54 reflective layer
56 transparent electrical conductor
60 LED
60R red LED
60G green LED
60B blue LED
94 tether
100 provide substrate step
105 provide semiconductor substrate with electronic circuit step
110 form electronic circuit on semiconductor substrate step
120 provide source wafer step
125 provide LED on source wafer step
130 form LED on source wafer step
140 dispose adhesive material step
150 micro-transfer print LED on semiconductor substrate step
160 optional cure adhesive layer step
170 connect electronic circuit to LED step

What is claimed:

1. A compound light-emitting diode (LED) device, comprising:
a semiconductor substrate having an active electronic circuit formed in or on the semiconductor substrate;
two or more electrically conductive circuit connection pads formed in or on the semiconductor substrate, the active electronic circuit electrically connected to the two or more circuit connection pads;
one or more LEDs, each LED having at least two LED electrodes or connection pads and a fractured LED tether;
an adhesive layer disposed between the semiconductor substrate and each LED, wherein each LED is micro-transfer printed on the adhesive layer and the adhesive layer adheres the semiconductor substrate to the LED; and
two or more electrical conductors, each electrical conductor electrically connecting one of the electrodes or LED connection pads to one of the circuit connection pads.

2. The compound LED device of claim 1, wherein the active electronic circuit is located at least partially between the LED and the semiconductor substrate.

3. The compound LED device of claim 1, wherein the LED has an opposite side that is opposite the semiconductor substrate and at least two of the LED connection pads are located on the opposite side.

4. The compound LED device of claim 1, wherein the LED has an adjacent side that is adjacent to the semiconductor substrate and at least two of the LED connection pads are located on the adjacent side.

5. The compound LED device of claim 1, wherein the LED has an opposite side opposite the semiconductor substrate and an adjacent side adjacent to the semiconductor substrate and at least one of the LED connection pads is located on the adjacent side and at least one of the LED connection pads is located on the opposite side.

6. The compound LED device of claim 1, wherein the active electronic circuit is a control circuit that controls the one or more LEDs.

7. The compound LED device of claim 1, comprising three LEDs, each LED having a different material, crystalline structure, or color of light emission.

8. The compound LED device of claim 1, comprising a plurality of groups of three different LEDs, the groups arranged in an array over the semiconductor substrate.

9. The compound LED device of claim 1, wherein the active electronic circuit is an active-matrix circuit.

10. The compound LED device of claim 9, wherein the semiconductor substrate has a process side, the electronic circuit is formed on or in the process side, and the LED is micro-transfer printed on the process side.

11. The compound LED device of claim 1, wherein the semiconductor substrate is a silicon substrate and each LED includes a compound semiconductor.

12. The compound LED device of claim 1, comprising two or more connection posts, each connection post electrically connected to a circuit connection pad or an LED connection pad.

13. The compound LED device of claim 1, wherein the semiconductor substrate is a display substrate and the one or more LEDs form a display.

14. The compound LED device of claim 13, wherein the display is a color display.

15. The compound LED device of claim 1, wherein each LED is directly or indirectly adhered to the semiconductor substrate with an adhesive layer.

16. The compound LED device of claim 15 wherein the adhesive is a cured adhesive.

17. The compound LED device of claim 1, wherein the semiconductor substrate or one or more LEDs has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm.

18. The compound LED device of claim 1, comprising a reflective structure around each LED that reflects light emitted by the LED out of the compound LED device.

19. A method of making a compound light-emitting diode (LED) device, comprising:
  providing a semiconductor substrate having an active electronic circuit formed in or on the semiconductor substrate and two or more electrically conductive circuit connection pads formed on the semiconductor substrate, the active electronic circuit electrically connected to the two or more circuit connection pads;
  providing one or more LEDs, each LED having at least two LED connection pads and a fractured LED tether;
  disposing an adhesive layer between the semiconductor substrate and each LED;
  disposing each LED on the adhesive layer and the adhesive layer adheres the semiconductor substrate to the LED; and
  forming two or more electrical conductors, each electrical conductor electrically connecting one of the LED connection pads to one of the circuit connection pads.

20. The method of claim 19, comprising micro-transfer printing the one or more LEDs from a source wafer to the semiconductor substrate.

* * * * *